(12) United States Patent
Amezawa

(10) Patent No.: US 9,191,028 B2
(45) Date of Patent: Nov. 17, 2015

(54) COMPLEX DIGITAL SIGNAL COMPRESSION DEVICE, METHOD AND COMPUTER-READABLE STORAGE MEDIUM, COMPLEX DIGITAL SIGNAL EXPANSION DEVICE, METHOD AND COMPUTER-READABLE STORAGE MEDIUM, AND COMMUNICATION DEVICE

(71) Applicant: MOBILE TECHNO CORP., Kanagawa-ken (JP)

(72) Inventor: Yasuharu Amezawa, Kanagawa-ken (JP)

(73) Assignee: Mobile Techno Corp., Kanagawa-Ken (JP)

( * ) Notice: Subject to any disclaimer, the term of this patent is extended or adjusted under 35 U.S.C. 154(b) by 0 days.

(21) Appl. No.: 14/619,945

(22) Filed: Feb. 11, 2015

(65) Prior Publication Data
US 2015/0244395 A1 Aug. 27, 2015

(30) Foreign Application Priority Data
Feb. 21, 2014 (JP) .................................. 2014-031432

(51) Int. Cl.
*H03M 7/30* (2006.01)
*H04L 27/34* (2006.01)
(52) U.S. Cl.
CPC *H03M 7/30* (2013.01); *H04L 27/34* (2013.01)
(58) Field of Classification Search
None
See application file for complete search history.

(56) References Cited

U.S. PATENT DOCUMENTS

| 6,421,400 B1 | 7/2002 | Rhee et al. | |
| 7,609,614 B2 * | 10/2009 | Fonseka et al. | 370/208 |
| 8,542,573 B2 * | 9/2013 | Liu et al. | 370/210 |

FOREIGN PATENT DOCUMENTS

EP 2590375 A1 5/2013

OTHER PUBLICATIONS

D. Samardzija et al. Compressed Transport of Baseband Signals in Radio Access Networks, IEEE, IEEE Transactions on Wireless Communications, vol. 11, No. 9, Sep. 2012.*

(Continued)

*Primary Examiner* — Howard Williams
(74) *Attorney, Agent, or Firm* — Bacon & Thomas, PLLC

(57) ABSTRACT

An object of the present invention is to provide the compression device and the expansion device of a complex digital signal, which further raise the compression ratio of the compression digital signal. The compression device of the present invention comprises: first section that acquires a first phase and a second phase, wherein with a complex digital signal being inputted into the complex digital signal compression device, the first phase is a phase, in polar coordinates, which the complex digital signal has, and it is assumed that the complex digital signal inputted into the complex digital signal compression device is expressed as a sum of two complex digital signals with an equal amplitude, phases of which are centered at the first phase and are shifted by a phase that equals to the second phase in the positive and negative direction respectively; and second section that compresses the first phase and the second phase respectively by performing quantization. The expansion device of the present invention comprises third section and fourth section which perform the inverse processing of the second section and the first section, respectively, mentioned above.

12 Claims, 4 Drawing Sheets

(56) References Cited

OTHER PUBLICATIONS

Karl F. Nieman and Brian L. Evans, "Time-Domain Compression of Complex-Baseband LTE Signals for Cloud Radio Access Networks", 2013 Proc. IEEE Global Conference on Signal and Information Processing, Dec. 2013; Akira Agata, Shinobu Nanba, "A Study on the Baseband Signal Compress Scheme for Base Stations in Cellular Networks", 2013 The Institute of Electronics, Information and Communication Engineers, General Conference, B-8-9, Mar. 2013.

Extended European Search Report Issued in Corresponding European Patent Application No. 15155678.4 on Jul. 1, 2015.

* cited by examiner

FIG.2

| θ-quantization | θ-bit-number | | EVM [%] | | | | | | | | |
|---|---|---|---|---|---|---|---|---|---|---|---|
| | | | Linear | | | | | | | | |
| | | | 2 | 3 | 4 | 5 | 6 | 7 | 8 | 9 | 10 |
| φ-quantization | | φ-bit-number | | | | | | | | | |
| Nonlinear | 2 | | 37.26 | 20.84 | 14.50 | 12.43 | 11.83 | 11.67 | 11.65 | 11.64 | 11.64 |
| | 3 | | 36.13 | 18.41 | 10.61 | 7.51 | 6.50 | 6.23 | 6.15 | 6.13 | 6.13 |
| | 4 | | 35.76 | 17.64 | 9.22 | 5.37 | 3.83 | 3.35 | 3.22 | 3.17 | 3.17 |
| | 5 | | 35.61 | 17.45 | 8.83 | 4.63 | 2.70 | 1.95 | 1.70 | 1.64 | 1.62 |
| | 6 | | 35.63 | 17.40 | 8.71 | 4.40 | 2.32 | 1.36 | 0.98 | 0.86 | 0.83 |
| | 7 | | 35.64 | 17.38 | 8.68 | 4.36 | 2.21 | 1.16 | 0.68 | 0.49 | 0.43 |

COMPLEX DIGITAL SIGNAL COMPRESSION DEVICE, METHOD AND COMPUTER-READABLE STORAGE MEDIUM, COMPLEX DIGITAL SIGNAL EXPANSION DEVICE, METHOD AND COMPUTER-READABLE STORAGE MEDIUM, AND COMMUNICATION DEVICE

CROSS-REFERENCE TO RELATED APPLICATION

This application claims, under 35 USC 119, priority of Japanese Application No. 2014-31432 filed on Feb. 21, 2014.

BACKGROUND OF THE INVENTION

1. Technical Field Relating to the Invention

The present invention relates to a complex digital signal compression device, a method, and a computer-readable storage medium, a complex digital signal expansion device, a method, and a computer-readable storage medium, and a communication device.

For example, the present invention can be applied to a cloud wireless access network where a base station configuration is divided into a Remote Radio Head (RRH) accommodating a user equipment (UE) and a Base Band Unit (BBU).

2. Background of Related Art

In the cloud wireless access network, connection is made via the link of a general-purpose interface such as a CPRI (Common Public Radio Interface) between a first communication device, which the above-mentioned RRH corresponds to, and a second communication device, which the BBU corresponds to. In the CPRI, between the first communication device and the second communication device, a complex digital signal (a complex baseband signal) is exchanged, which is an upstream signal or a downstream signal. In the CPRI, it is not specified that a compressed complex digital signal is exchanged, but it has been proposed that one transmits a compressed complex digital signal to a CPRI link and the other expands the compressed signal to restore an original complex digital signal.

Conventionally, when a complex digital signal is compressed, compression has been performed individually on the real number component and the imaginary number component of the complex digital signal. In a technology described in Non-Patent Document 1 (Karl F. Nieman and Brian L. Evans, "Time-Domain Compression of Complex-Baseband LTE Signals for Cloud Radio Access Networks", 2013 Proc. IEEE Global Conference on Signal and Information Processing, December, 2013), the numbers of bits of a real number component and an imaginary number component after analog/digital conversion are respectively compressed to one-third, i.e. from 15 bits to 5 bits, by using re-quantization with a noise-shape filter and rate conversion. Moreover, in a technology described in Non-Patent Document 2(Akira Agata, Shinobu Nanba, "A Study on the Baseband Signal Compression Scheme for Base Stations in Cellular Networks", 2013 The Institute of Electronics, Information and Communication Engineers, General Conference, B-8-9, March, 2013), the numbers of bits of a real number component and an imaginary number component after analog/digital conversion are respectively compressed to one-half by using means, which reduces the number of bits from 16 bits to 14 bits, and Free Lossless Audio Codec, which is an audio compression technology.

SUMMARY OF THE INVENTION

However, in a mobile communication field, for example, as described in Non-Patent Document 2, a transmission rate on the CPRI reaches several tens Gbps for each base station because of the progress of MIMO (Multiple-Input and Multiple-Output) or multiple bands. Therefore, a technology for further improving a compression ratio is required without deteriorating signal quality due to compression and expansion.

The present invention is devised in consideration of the above viewpoint. An object of the present invention is to provide a complex signal compression device and a program, and a complex signal expansion device and a program, which can further improve the compression ratio of a complex digital signal without deteriorating signal quality. Another object of the present invention is to provide a communication device equipped with such a complex digital signal compression device or a program, and a complex digital signal expansion device or a program.

A first aspect of the present invention is characterized as follows. A complex digital signal compression device that compresses a complex digital signal comprises: (1) signal/two-phase conversion section that acquires a first phase and a second phase, wherein with a complex digital signal being inputted into the complex digital signal compression device, the first phase is a phase, in polar coordinates, which the complex digital signal has, and it is assumed that the complex digital signal inputted into the complex digital signal compression device is expressed as a sum of two complex digital signals with an equal amplitude, phases of which are centered at the first phase and are shifted by a phase that equals to the second phase in the positive and negative direction respectively; (2) compression section that compresses the first phase and the second phase respectively by performing quantization.

A second aspect of the present invention is characterized as follows. A complex digital signal expansion device that expands a compressed signal compressed by the complex digital signal compression device of the first aspect of the present invention, comprises: (1) expansion section that extracts quantized values of the first phase and the second phase included in the compressed signal and performs inverse quantization on each of the quantized values; and (2) two-phase/signal conversion section that restores a complex digital signal based on the first phase and the second phase which the expansion section has acquired.

A third aspect of the present invention is characterized as follows. A communication device, which compresses a complex digital signal by a complex digital signal compression device mounted thereon and which transmits a compressed signal toward an opposite communication device, is characterized in that a complex digital signal compression device of the first aspect of the present invention is applied as the complex digital signal compression device.

A fourth aspect of the present invention is characterized as follows. A communication device, which expands a compressed signal arriving from an opposite communication device by a complex digital signal expansion device mounted thereon and which restores a complex digital signal, is characterized in that a complex digital signal expansion device of the second aspect of the present invention is applied as the complex digital signal expansion device.

A fifth aspect of the present invention is characterized as follows. A method for compressing a complex digital signal comprising the steps of: (1) signal/two-phase conversion that acquires a first phase and a second phase, wherein with a complex digital signal being inputted into a complex digital signal compression device, the first phase is a phase, in polar coordinates, which the complex digital signal has, and it is assumed that the complex digital signal inputted into the complex digital signal compression device is expressed as a sum of two complex digital signals with an equal amplitude, phases of which are centered at the first phase and are shifted by a phase that equals to the second phase in the positive and negative direction respectively; and (2) compressing the first phase and the second phase respectively by performing quantization.

A sixth aspect of the present invention is characterized as follows. A computer-readable storage medium comprising: (1) signal/two-phase conversion means that acquires a first phase and a second phase, wherein with a complex digital signal being inputted into a complex digital signal compression device, the first phase is a phase, in polar coordinates, which the complex digital signal has, and it is assumed that the complex digital signal inputted into the complex digital signal compression device is expressed as a sum of two complex digital signals with an equal amplitude, phases of which are centered at the first phase and are shifted by a phase that equals to the second phase in the positive and negative direction respectively; and (2) compression means that compresses the first phase and the second phase respectively by performing quantization.

Advantageous Effects of Invention

According to the present invention, the compression ratio of a complex digital signal can be improved further without deteriorating signal quality.

BRIEF DESCRIPTION OF DRAWINGS

FIG. 2 is a table showing characterization results obtained by a simulation for the compression method of a complex digital signal in the first embodiment;

DETAILED DESCRIPTION OF THE PREFERRED EMBODIMENTS (A) First Embodiment

With reference to the drawings, descriptions will be made below on a complex digital signal compression device, a method, and a computer-readable storage medium, a complex digital signal expansion device, a method, and a computer-readable storage medium, and a first embodiment of a communication device.

(A-1) Configuration of First Embodiment

The communication device of the first embodiment is one device chosen between a RRH and a BBU, which are opposite to each other via a CPRI link and which constitute a base station. In the first embodiment, a complex digital signal is exchanged via the CPRI link by compressing the complex digital signal.

When the communication device of the first embodiment is the RRH, a signal compressed by the complex digital signal compression device of the first embodiment provided in the upstream direction is sent to the CPRI link; and the compressed signal arriving from the CPRI is expanded by the complex digital signal expansion device of the first embodiment provided in the downstream direction to restore the baseband signal of the complex digital signal. On the other hand, when the communication device of the first embodiment is the BBU, a signal compressed by the complex digital signal compression device of the first embodiment provided in the downstream direction is sent to the CPRI link; and the compressed signal arriving from the CPRI link is expanded by the complex digital signal expansion device of the first embodiment provided in the upstream direction to restore the baseband signal of the complex digital signal.

Figure 1:
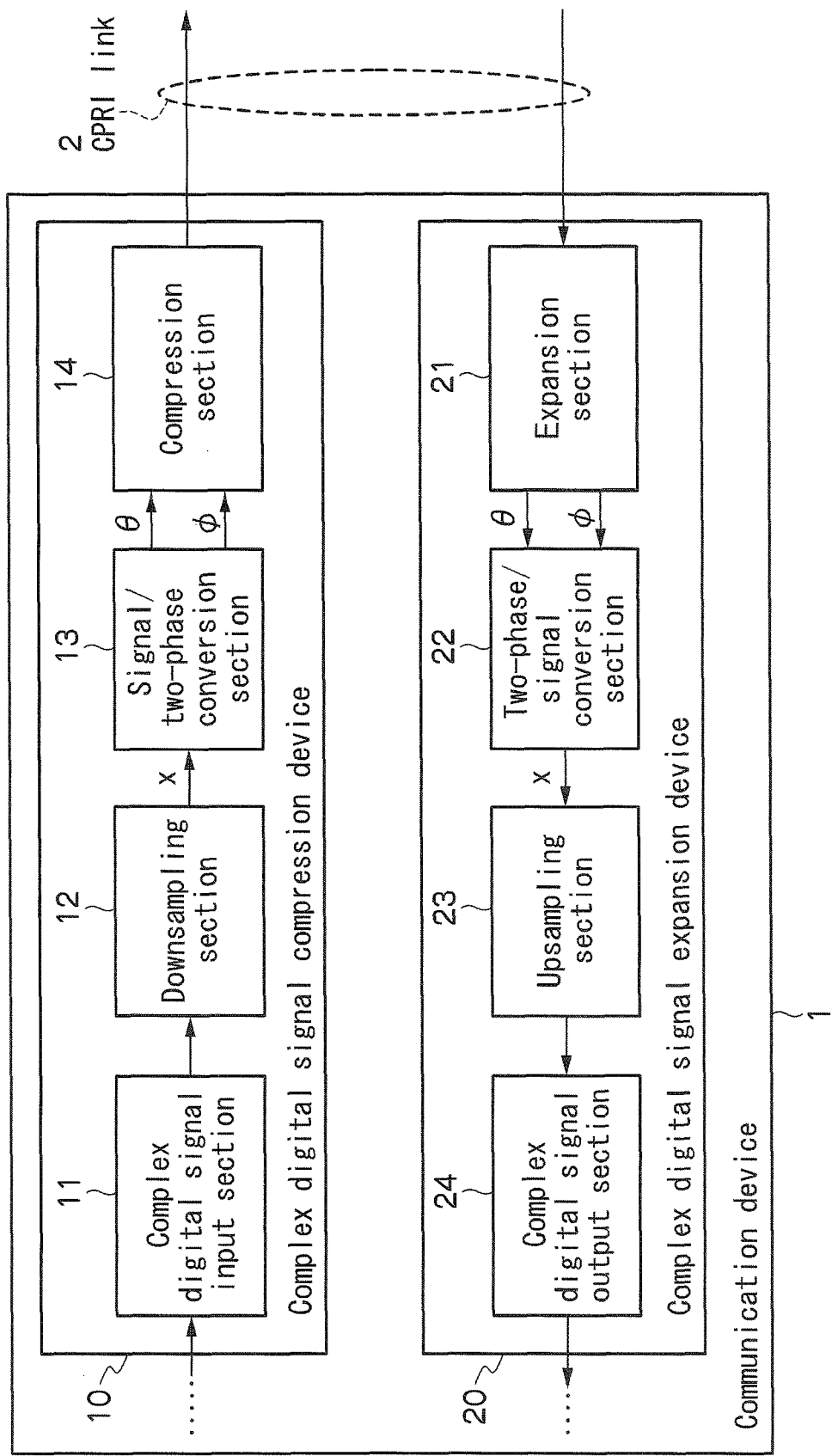
FIG. 1 is a block diagram showing a characteristic configuration in the communication device of a first embodiment.

FIG. 1 is a block diagram showing a characteristic configuration in the communication device of the first embodiment.

The characteristic configuration in the communication device of the first embodiment can be constituted by hardware, and can also be realized by a CPU and software (a complex digital signal compression device program and a complex digital signal expansion program) executed by the CPU. Regardless of which method is adopted, the characteristic configuration can be represented as in FIG. 1 from a functional point of view.

In FIG. 1, the communication device 1 has a complex digital signal compression device 10 and a complex digital signal expansion device 20.

The complex digital signal compression device 10 compresses a complex digital signal imparted from a preceding stage and sends a compressed signal to a CPRI link 2. The complex digital signal compression device 10 has a complex digital signal input section 11, a downsampling section 12, a signal/two-phase conversion section 13 and a compression section 14.

The complex digital signal expansion device 20 expands a compressed signal arriving from the CPRI link 2 and outputs an obtained complex digital signal to a processing section of a later stage. The complex digital signal expansion device 20 has an expansion section 21, a two-phase/signal conversion section 22, an upsampling section 23 and a complex digital signal output section 24.

The complex digital signal input section 10 in the complex digital signal compression device 10 captures a complex digital signal to be compressed. Although the number of bits of a complex digital signal is not questioned, a real number part and an imaginary number part can be expressed, for example, by 15 bits respectively.

The downsampling section 11 performs downsampling of a signal inputted according to the occupied band of a complex digital signal. Here, when the complex digital signal is an LTE (Long Term Evolution) signal, downsampling is performed to three-fourths. The downsampling section 11 and the upsampling section 23, which is to be mentioned later, may be omitted, depending on the use of the complex digital signal compression device 10 and the complex digital signal expansion section device 20.

The signal/two-phase conversion section 13 imparts a first phase $\theta$ and a second phase $\phi$ to the compression section 14, based on the assumption as follows: a complex digital signal, which has the phase $\theta$ ($\theta$ is also called the first phase), imparted from the downsampling section 11 is expressed as a sum of two complex digital signal with an equal amplitude; and phases of the two complex digital signal are centered at $\theta$ and are shifted by the same phase $\phi$ ($\phi$ is also called the second phase) in the positive and the negative direction respectively.

If an inputted complex digital signal is assumed to be x, the first phase $\theta$ is expressed by Equation (1). If a predetermined value (an arbitrary constant) y is introduced, the inputted complex digital signal x can be expressed as the sum of two complex digital signal with an equal amplitude as shown in Equation (3), also by using the second phase $\phi$ expressed as in Equation (2).

$$\theta = \tan^{-1}(x) \quad (1)$$

$$\phi = \cos^{-1}(|x|/2y) \quad (2)$$

$$x = y \cdot \exp(j(\theta+\phi)) + y \cdot \exp(j(\theta-\phi)) \quad (3)$$

The signal/two-phase conversion section 13, for example, performs the computation of Equations (1) and (2) without transposing the inputted complex digital signal x to the expression of Equation (3), and imparts the first phase θ and the second phase φ, which have been acquired, to the compression section 14. Both of the first phase θ and the second phase φ are certain values which are in a range from 0 to 2Π (or in a range from −Π to Π).

The compression section 14 compresses the first phase θ and the second phase φ respectively by quantizing them, and send a compressed signal, which includes first compression information after compressing the first phase θ and second compression information after compressing the second phase φ, to the CPRI link 2.

Here, even if the numbers of bits of the first phase θ and the second phase φ before compression are the same, the number of bits (which is inversely proportional to a compression ratio for the first phase θ) of the first compression information after compressing the first phase θ may be the same as, or different from the number of bits (which is inversely proportional to a compression ratio for the second phase φ) of the second compression information after compressing the second phase φ.

For example, if the real number component and the imaginary number component of the inputted complex digital signal x have independent Gaussian distribution respectively, although details are not described, the distribution of the first phase θ is uniform, and the distribution of the second phase φ is biased around a certain value. Since a distribution width in which there exists relatively large probability density (which corresponds to frequency in a histogram) is different, it is a preferred aspect that the number of bits of the first compression information reflecting the first phase θ is larger than the number of bits of the second compression information reflecting the second phase φ. Moreover, when the accuracy of a complex digital signal after expansion in the complex digital signal expansion device 20 is taken into consideration, it is preferable that the number of bits of the first compression information reflecting the first phase θ, which is the information of the complex digital signal x itself, is larger than the number of bits of the second compression information reflecting the second phase φ, which is calculated as auxiliary information.

As a quantization method for the first phase θ, there may be applied a linear quantization method where a constant quantization level (a quantization step) is applied regardless of the value of the first phase θ, and there may also be applied a nonlinear quantization method where a quantization level is changed according to the value of the first phase θ. Similarly, as a quantization method for the second phase φ, there may be applied a linear quantization method where a constant quantization level is applied regardless of the value of the second phase φ, and there may also be applied a nonlinear quantization method where a quantization level is changed according to the value of the second phase φ.

For example, if the real number component and the imaginary number component of an inputted complex digital signal x have independent Gaussian distribution respectively, since the distribution of the first phase θ is uniform and the distribution of the second phase φ is biased around a certain value as described above, it is a preferred aspect that a linear quantization method is applied for the first phase θ and a nonlinear quantization method is applied to the second phase φ. In this case, the quantization level $X_q$ of the second phase φ may be calculated according to Equation (4). Equation (4) is similar to Equation (3) of Non-Patent Document 1. In Equation (4), PDF (φ) is a probability density function. The probability density function can be accurately determined by measuring an inputted complex digital signal, and since the distribution of the inputted complex digital signal is known, the quantization level $X_q$ can be calculated in advance according to Equation (4). Since the quantization level $X_q$ is determined one-to-one to the second phase φ, the second compression information, which is determined by applying the quantization level for the second phase φ is also determined one-to-one to the second phase φ. That is, there is prepared a translation table in advance, where a range which the second phase φ belongs to and the second compression information are associated one-to-one, and by using the translation table, the second compression information corresponding to the value of the second phase φ may be obtained. Also when the linear quantization method is applied to the first phase φ, a translation table may be utilized in a similar manner.

$$X_q = \Sigma \phi \cdot PDF(\phi) / \Sigma PDF(\phi) \quad (4)$$

After extracting the first compression information and the second compression information from a compressed signal arriving from the CPRI link 2, the expansion section 21 in the complex digital signal expansion device 20 converts (expands) the first compression information and the second compression information into the first phase θ and the second phase φ respectively, and imparts them to the two-phase/signal conversion section 22. This conversion may be performed by computation to which a quantization level is applied, or by a method where an inverse translation table is applied for the input/output of the translation table described in the explanation of the compression section 14.

Based on the first phase θ and the second phase φ imparted from the expansion section 21 and also based on a constant y retained inside, the two-phase/signal conversion section 22 acquires the complex digital signal x and imparts it to the upsampling section 23. The two-phase/signal conversion section 22 acquires the complex digital signal x, for example, by performing the computation of Equation (3) described above. The complex digital signal may be acquired by computation where y-times in the right hand side of Equation (3) is omitted, although this does not correspond to the complex digital signal x in the complex digital signal compression device 10. Even in this way, there can be acquired a complex digital signal having a linear relationship with the complex digital signal x. In this case, there is no need that the two-phase/signal conversion section 22 retains the constant y.

The upsampling section 23 performs the inverse processing of the downsampling section 12 in the complex digital signal compression device 10, and imparts a complex digital signal after processing to the complex digital signal output section 24. For example, if the downsampling section 12 downsamples an input complex digital signal to three-fourths, the upsampling section 23 raises the sampling rate of a complex digital signal from the two-phase/signal conversion section 22 to four-thirds. When the complex digital signal compression device 10 is not provided with the downsampling section 12, it is configured that the complex digital signal expansion device is not provided with the upsampling section 23 either.

The complex digital signal output section 24 outputs a complex digital signal imparted from the upsampling section 23 to the processing section of the later stage.

(A-2) Operation of First Embodiment

Next, the operation of the communication device 1 of the first embodiment will be described, in the order of an operation in the complex digital signal compression device 10 and an operation in the complex digital signal expansion device 20.

In the complex digital signal compression device 10, a complex digital signal to be compressed, which is captured by the complex digital signal input section 10, is downsampled by the downsampling section 11.

Based on a complex digital signal x after downsampling, a first phase θ, which the complex digital signal x has, and a second phase φ are calculated by the signal/two-phase conversion section 13, and the first phase θ and the second phase φ are imparted to the compression section 14; wherein it is assumed that the complex digital signal x is expressed as the sum of two complex digital signal with an equal amplitude, the phases of which are centered at the phase θ and are shifted by the same phase that equals to the second phase φ in the positive and negative direction.

In the compression section 14, the first phase θ and the second phase φ are respectively compressed by being quantized, and a compressed signal, which includes the first compression information after the first phase θ has been compressed and the second compression information after the second phase φ has been compressed, is sent to the CPRI link 2.

Next, an operation in the complex digital signal expansion device 20 will be described.

In the complex digital signal expansion device 20, a compressed signal arriving from the CPRI link 2 is imparted to the expansion section 21, where the first compression information and the second compression information are extracted. The first compression information and the second compression information that have been extracted are converted (expanded) into the first phase θ and the second phase φ respectively, which are then imparted to the two-phase/signal conversion section 22.

In the two-phase/signal conversion section 22, based on the first phase θ and the second phase φ that have been imparted from the expansion section 21 and also based on the constant y retained inside, the complex digital signal x is restored and is imparted to the upsampling section 23.

Then, in the upsampling section 23, the restored complex digital signal is upsampled to a predetermined sampling rate, and is outputted from the complex digital signal output section 24 to the processing section of the later stage.

(A-3) Effect of First Embodiment

According to the first embodiment, since the compression information exchanged between the complex digital signal compression device and the complex digital signal expansion device is created by quantizing two phase information items, i.e. the first phase θ and the second phase φ acquired from a complex digital signal to be exchanged, a high compression ratio can be realized.

In particular, as in the first embodiment, when downsampling is performed as the pre-processing of compression in the compression side, a much higher compression ratio can be realized.

For example, as the compression method of a complex digital signal, there exists a method where compression is performed separately for the real number component and the imaginary number component of the complex digital signal, but compression can be performed more efficiently in the compression method of the first embodiment. In the first embodiment, since the dynamic ranges of the two phases are in a constant range of from 0 to 2Π, the number of bits after quantization can be greatly suppressed; on the other hand, since an upper limit cannot be theoretically determined for amplitude information, it is preferable that a wide dynamic range is ensured, making it difficult to greatly suppress the number of bits after quantization.

Moreover, there can be considered a method, for example, where a complex digital signal is expressed by an amplitude and a phase in polar coordinates and these two information items are compressed. A disadvantage accompanied by the quantization of an amplitude is as described above. Phases in polar coordinates are distributed uniformly in a range of from 0 to 2Π. Since the second phase φ, between the two phases in the first embodiment, represents a shift from the first phase θ, it can be efficiently quantized when nonlinear quantization is applied, and thus good compression efficiency is obtained. If an amplitude in polar coordinates is associated with the first phase θ in the first embodiment and if a phase in polar coordinates is associated with the second phase φ in the first embodiment from the magnitude of the number of bits that are required, it can be clearly understood that a much higher compression rate can be realized in the compression method of the first embodiment.

According to the first embodiment, as mentioned above, the processing of the compression section 14 and the expansion section 21 can be performed by utilizing the translation table. When the translation table is utilized, even if a compression ratio is raised, increase in the amount of processing and the amount of computation is suppressed, which can prevent the increase of processing delay and the complication of a configuration. Although no mention was made in the above description, the computation of Equations (1) and (2) can also be performed using a translation table. When performed in this way, the translation table can be successful.

The present inventor performed a simulation that evaluates the compression method of the first embodiment, that is, characterization was performed based on the assumption that there is inputted an LTE signal with a 10-MHz bandwidth described in TABLE II of Non-Patent Document 1. In the downsampling section 12, since a FFT size is 1024 and an occupying subcarrier is 601, downsampling was performed so that a rate may be reduced to three-fourths. Moreover, with regard to the quantized bit number of the first phase θ and the second phase φ, a combination was selected so as to exhibit the best characteristic; in general, when the quantized bit number of the second phase φ is larger by two bits than the quantized bit number of the first phase θ, a good combination was obtained.

Figure 3:
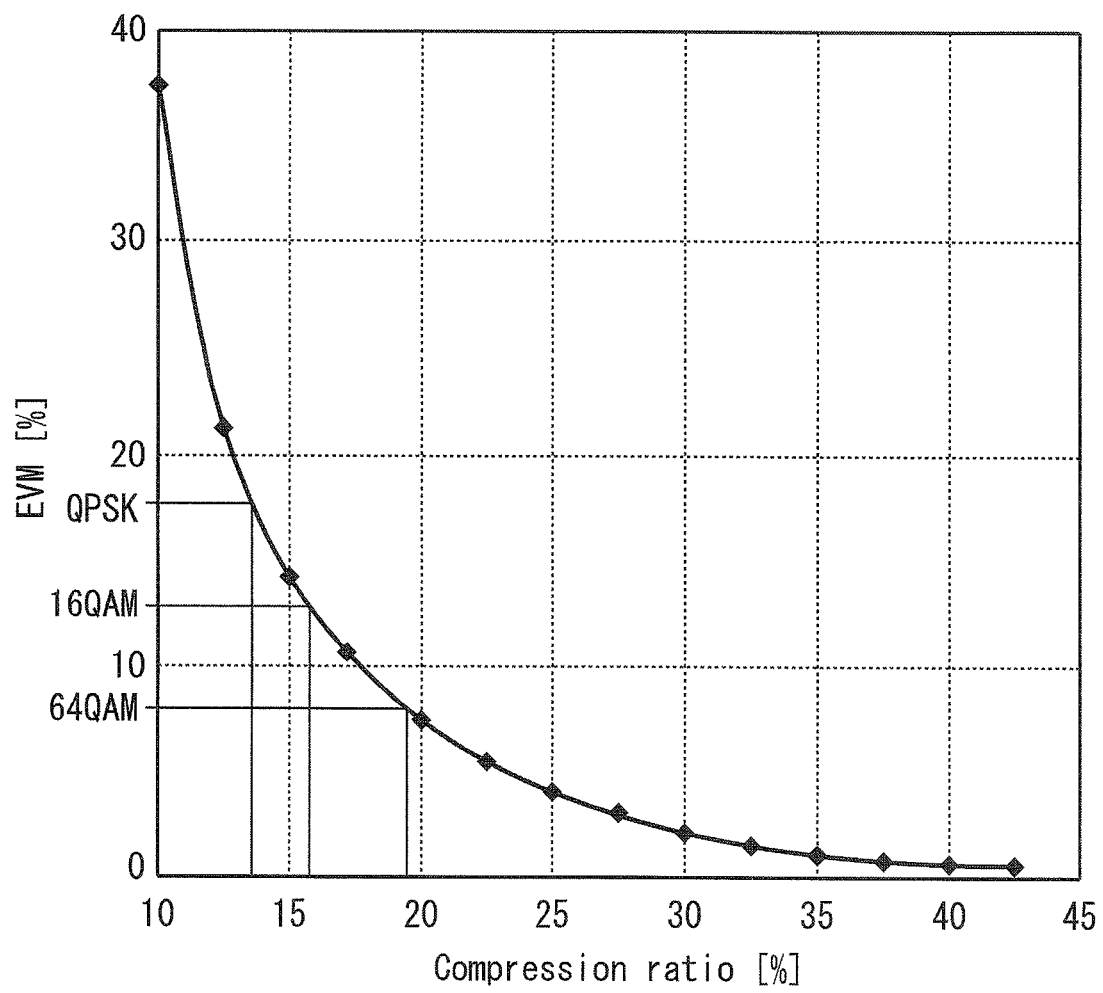
FIG. 3 is a graph showing compression ratio vs. EVM characteristic created based on the characterization results of FIG. 2.

FIG. 2 is a table showing characterization results obtained by a simulation, and FIG. 3 is a graph showing compression ratio vs. EVM characteristic based on the characterization results (of the shading portions) of FIG. 2.

The characterization results by the simulation show that the compression ratio of 35% for EVM (Error Vector Magnitude) =1% and the compression ratio of 30% for EVM=2% are obtained. It can be confirmed that the former is improved compared with 50% in Non-Patent Document 2 and the latter is improved compared with 33% in Non-Patent Document 1. Moreover, at the time of EVM=8%, which is the requirement of the LTE in 64QAM, the compression ratio can be increased to 19.5% in the compression method of the first embodiment.

(B) Second Embodiment

Next, with reference to the drawings, descriptions will be made on a complex digital signal compression device, a method, and a computer-readable storage medium, a complex digital signal expansion device, a method, and a computer-readable storage medium, and the communication device of a second embodiment according to the present invention.

Figure 4:
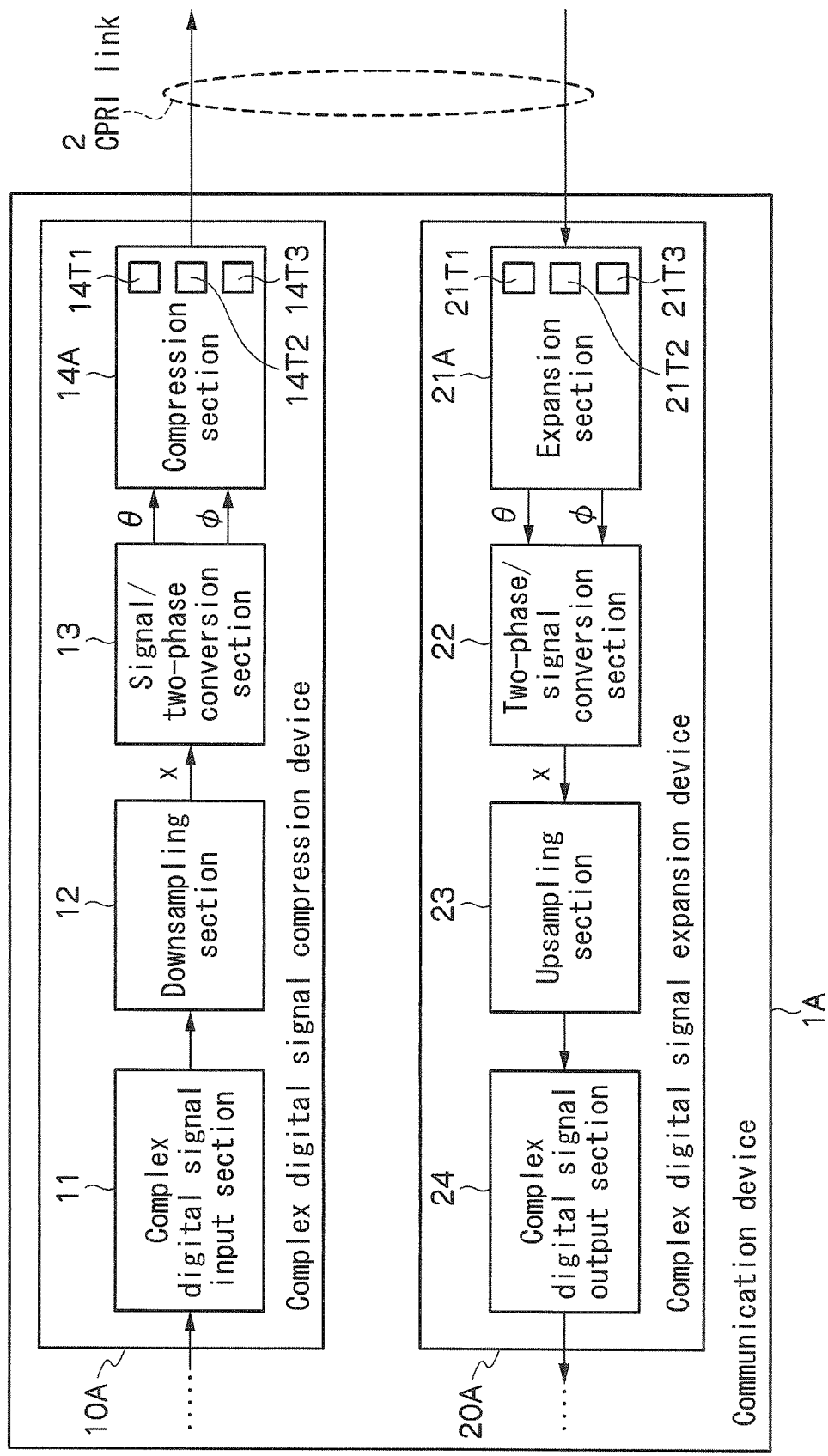
FIG. 4 is a block diagram showing a characteristic configuration in the communication device of a second embodiment.

FIG. 4 is a block diagram showing a characteristic configuration in the communication device of the second embodiment. With regard to sections same as or corresponding to the sections of FIG. 1 according to the first embodiment, same numerals or corresponding numerals are allotted as shown in FIG. 4.

A communication device 1A of the second embodiment differs from the communication device 1 of the first embodiment in a compression section 14A of a complex digital signal compression device 10A and in an expansion section 21A of a complex digital signal expansion device 20A.

In the second embodiment, with regard to both the compression section 14A and the expansion section 21A, quantization (compression) or inverse quantization (expansion) for the processing of the second phase $\phi$ is performed by using a translation table.

The compression section 14A is provided with a plurality of (here, three) translation tables, 14T1 to 14T3, for performing quantization of the second phase $\phi$, and the expansion section 21A is provided with a plurality of (three) translation tables, 21T1 to 21T3, for performing inverse quantization of the second phase $\phi$. The compression section 14A and the expansion section 21A perform quantization (compression) and inverse quantization (expansion) respectively, by applying the translation tables 14Ti and 21Ti (i=1 to 3) selected according to the operation of an operator such as a user and an installation personnel.

Here, there is no limitation about the viewpoint that the plurality of (three) translation tables, 14T1 to 14T3 or 21T1 to 21T3, are provided, and there can be mentioned viewpoints as exemplified below.

A first viewpoint is aimed at making a compression ratio selectable. That is, there are provided a plurality of translation tables, 14T1 to 14T3 and 21T1 to 21T3, which differ from one another in the number of bits after compression (before expansion), and translation tables 14Ti and 21Ti are applied according to a compression ratio which an operator has selected.

A second viewpoint is aimed at making a nonlinear quantization method selectable. There are determined a plurality of combinations of ranges in which the second phase $\phi$ can take a same value after compression, and there are provided a plurality of translation tables, 14T1 to 14T3 and 21T1 to 21T3, which correspond to each of the combinations respectively, and translation tables 14Ti and 21Ti are applied according to a nonlinear quantization method which the operator has selected.

In a third viewpoint, there are provided translation tables, 14T1 to 14T3 and 21T1 to 21T3, for each of the combinations of a compression ratio and a nonlinear quantization method, and translation tables 14Ti and 21Ti are applied according to the combination of a compression ratio and a nonlinear quantization method which the operator has selected.

In a fourth viewpoint, for each constant y applied when the second phase $\phi$ is calculated, there may be provided translation tables, 14T1 to 14T3 and 21T1 to 21T3, from which the operator selects.

In the above, although there was shown a case where the plurality of translation tables, 14T1 to 14T3 and 21T1 to 21T3, are provided for the quantization and the inverse quantization of the second phase $\phi$, in addition to this, a plurality of translation tables for the quantization and the inverse quantization of the first phase $\theta$ may be provided, which are selectable. Here, one selection operation may serve both as the selection instruction of a translation table relating to the second phase $\phi$ and as the selection instruction of a translation table relating to the first phase $\theta$. That is, one selection operation may inter-connectedly perform the selection of a translation table relating to the second phase $\phi$ and the selection of a translation table relating to the first phase $\theta$.

In the above, although there was shown a case where a translation table to be applied is selected by an operator from a plurality of translation tables, a translation table to be applied may be automatically determined. For example, automatic determination may be performed as follows: there are prepared in advance a plurality of translation tables for which different distributions are applied as the distribution of the second phase $\phi$; the distribution (histogram) of the second phase $\phi$ is calculated at the initial time of communication; a translation table is applied such that a distribution premised when the translation table was created is most consistent with the calculated distribution.

According to the second embodiment, in addition to a similar effect as the first embodiment, there is a successful effect that a quantization (compression) method and an inverse quantization (expansion) method can be selected in the compression section and the expansion section.

(C) Other Embodiments

In each of the above embodiments, the complex digital signal compression device and the complex digital signal expansion device of the present invention were described based on the assumption that they are applied to a cloud wireless access network including an RRH and a BBU, but the use of the complex digital signal compression device and the complex digital signal expansion device of the present invention is not limited to this.

Moreover, each of the above embodiments shows that one communication device is provided with a complex digital signal compression device and a complex digital signal expansion device, but one communication device may be provided with either of a complex digital signal compression device or a complex digital signal expansion device.

The invention claimed is:

1. A complex digital signal compression device that compresses a complex digital signal, comprising:
signal/two-phase conversion section that acquires a first phase and a second phase, wherein with a complex digital signal being inputted into the complex digital signal compression device, the first phase is a phase, in polar coordinates, which the complex digital signal has, and it is assumed that the complex digital signal inputted into the complex digital signal compression device is expressed as a sum of two complex digital signals with an equal amplitude, phases of which are centered at the first phase and are shifted by a phase that equals to the second phase in the positive and negative direction respectively; and
compression section that compresses the first phase and the second phase respectively by performing quantization.

2. A complex digital signal compression device according to claim 1,
further comprising downsampling section which decreases a sampling rate of an inputted complex digital signal and which imparts a signal with a decreased sampling rate to the signal/two-phase conversion section.

3. A communication device which compresses a complex digital signal by a complex digital signal compression device mounted thereon and which transmits a compressed signal toward an opposite communication device, characterized in that a complex digital signal compression device according to claim 2 is applied as the complex digital signal compression device.

4. A complex digital signal expansion device that expands a compressed signal compressed by the complex digital signal compression device of claim 1, comprising:

expansion section that extracts quantized values of the first phase and the second phase included in the compressed signal and performs inverse quantization on each of the quantized values; and two-phase/signal conversion section that restores a complex digital signal based on the first phase and the second phase which the expansion section has acquired.

5. A complex digital signal expansion device according to claim 4, further comprising upsampling section that increases a sampling rate of a complex digital signal which the two-phase/signal conversion section has restored.

6. A communication device which expands a compressed signal arriving from an opposite communication device by a complex digital signal expansion device mounted thereon and which restores a complex digital signal, characterized in that a complex digital signal expansion device according to claim 5 is applied as the complex digital signal expansion device.

7. A communication device which expands a compressed signal arriving from an opposite communication device by a complex digital signal expansion device mounted thereon and which restores a complex digital signal, characterized in that a complex digital signal expansion device according to claim 4 is applied as the complex digital signal expansion device.

8. A method for expanding a complex digital signal comprising the steps of:

inputting a compressed signal compressed by the complex digital signal compression device of claim 1 into a digital signal expansion device;

extracting quantized values of the first phase and the second phase included in the compressed signal;

expansion where inverse quantization of each of the first phase and the second phase performed; and two-phase/signal converting where a complex digital signal based on the first phase and the second phase which the expansion step has acquired are restored.

9. A non-transitory computer-readable storage medium having instructions stored thereon comprising:

expansion means, wherein with a compressed signal compressed by the complex digital signal compression device of claim 1 being inputted, the expansion means extracts quantized values of the first phase and the second phase included in the compressed signal and performs inverse quantization on each of the quantized values; and two-phase/signal conversion means that restores a complex digital signal based on the first phase and the second phase which the expansion means has acquired.

10. A communication device which compresses a complex digital signal by a complex digital signal compression device mounted thereon and which transmits a compressed signal toward an opposite communication device, characterized in that a complex digital signal compression device according to claim 1 is applied as the complex digital signal compression device.

11. A method for compressing a complex digital signal comprising the steps of:

signal/two-phase conversion that acquires a first phase and a second phase, wherein with a complex digital signal being inputted into a complex digital signal compression device, the first phase is a phase, in polar coordinates, which the complex digital signal has, and it is assumed that the complex digital signal inputted into the complex digital signal compression device is expressed as a sum of two complex digital signals with an equal amplitude, phases of which are centered at the first phase and are shifted by a phase that equals to the second phase in the positive and negative direction respectively; and compressing the first phase and the second phase respectively by performing quantization.

12. A non-transitory computer-readable storage medium having instructions stored thereon comprising:

signal/two-phase conversion means that acquires a first phase and a second phase, wherein with a complex digital signal being inputted into a complex digital signal compression device, the first phase is a phase, in polar coordinates, which the complex digital signal has, and it is assumed that the complex digital signal inputted into the complex digital signal compression device is expressed as a sum of two complex digital signals with an equal amplitude, phases of which are centered at the first phase and are shifted by a phase that equals to the second phase in the positive and negative direction respectively; and compression means that compresses the first phase and the second phase respectively by performing quantization.

* * * * *